United States Patent
Kojima

(10) Patent No.: US 7,123,089 B2
(45) Date of Patent: Oct. 17, 2006

(54) POWER AMPLIFIER WITH PULSE DIFFERENTIATING CIRCUIT

(75) Inventor: Haruo Kojima, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 161 days.

(21) Appl. No.: 10/929,524

(22) Filed: Aug. 31, 2004

(65) Prior Publication Data

US 2005/0104656 A1    May 19, 2005

(30) Foreign Application Priority Data

Nov. 19, 2003    (JP)    ............................. 2003-389498

(51) Int. Cl.
*H03G 3/30*    (2006.01)
(52) U.S. Cl. ....................... 330/133; 330/281; 330/284
(58) Field of Classification Search ................ 330/133, 330/134, 137, 141, 144
See application file for complete search history.

(56) References Cited

U.S. PATENT DOCUMENTS 5,194,823 A * 3/1993 Wendt et al. ................ 330/137

2001/0014593 A1    8/2001  McCune ...................... 455/121
2002/0140503 A1   10/2002  Fujiwara et al. .............. 330/51

FOREIGN PATENT DOCUMENTS

| JP | 55-49044 | 4/1980 |
| JP | 59-37737 | 3/1984 |
| JP | 2001-16045 | 1/2001 |

* cited by examiner

*Primary Examiner*—Steven J. Mottola
(74) *Attorney, Agent, or Firm*—Oblon, Spivak, McClelland, Maier & Neustadt, P.C.

(57) ABSTRACT

An amplifier includes a plurality of power amplifier elements connected in cascaded multiple stages, a first bias power supply, a second bias power supply, a switching circuit configured to switch a first output supplied from the first bias power supply in response to a modulation pulse so as to transmit the first output to the plurality of power amplifier elements, a pulse differentiating circuit configured to differentiate the modulation pulse by a given time constant, and an adder circuit configured to add the differentiated modulation pulse and a second output of the second bias power supply so as to transmit the differentiated modulation pulse added to the second output as an input bias voltage to at least one of the plurality of power amplifier elements except for a final stage in the cascaded multiple stages.

8 Claims, 8 Drawing Sheets

POWER AMPLIFIER WITH PULSE DIFFERENTIATING CIRCUIT

CROSS REFERENCE TO RELATED APPLICATIONS

This application is based upon and claims the benefit of priority from prior Japanese Patent Application P2003-389498 filed on Nov. 19, 2003; the entire contents of which are incorporated by reference herein.

BACKGROUND OF THE INVENTION

1. Field of the Invention

The present invention relates to an amplifier, especially a pulse power amplifier used for a pulse radar transmission system.

2. Description of the Related Art

In the technical field of pulse radar transmission systems, a pulse power amplifier is applied thereto. The pulse power amplifier includes a semiconductor element, for example, a field effect transistor (FET), for amplifying electrical power. As shown in FIG. 1, a pulse power amplifier 50 includes an FET 51, an FET 52, an FET 53, and a switching circuit 54. Additionally, the pulse power amplifier 50 includes a signal input terminal 55, a signal output terminal 56, and a pulse input terminal 57. A source signal is supplied to the signal input terminal 55. An amplified signal is transmitted to the signal output terminal 56. The FETs 51 to 53 are connected in three cascaded stages. The FETs 51, 52, and 53 have gate electrodes serving as input terminals, drain electrodes serving as output terminals, and source electrodes serving as common terminals. A voltage of a positive bias power supply 60 is switched by the switching circuit 54 in response to a modulation pulse transmitted from the pulse input terminal 57 so as to be delivered to the drain electrodes for amplifying operations. An input voltage of a negative bias power supply 61 is delivered to the gate electrodes. Then, the source signal supplied from the signal input terminal 55 is amplified by the FETs 51 to 53, and is modulated based on the modulation pulse to be transmitted as a transmission pulse. The Japanese laid open publication (Kokai) 2001-16045 discloses equalization of saturated output power so as to keep the transmission pulse constant by varying a bias voltage supplied to a drain electrode of an FET serving as a power amplifier element.

SUMMARY OF THE INVENTION

In the related art as shown in FIG. 1, an increase of channel temperature of the FETs 51 to 53 causes a decrease of an amplification gain. That is, amplitude in one pulse from a leading edge of the pulse toward a trailing edge thereof varies based on thermal time constants of the channel. In case of the Japanese laid open, the FETs used as the power amplifier elements are rendered operational in saturated areas to cause a drop to occur in the resulting saturated output power. Therefore, the output tends to contain intermodulation distortion at a higher order. Also, a difficulty has been encountered in obtaining an amplification characteristic with a favorable linearity. Further, due to the presence of an inability of responding to variation in the amplification gain of the FET, another difficulty has been encountered in adequately eliminating amplitude variation in one pulse during an amplifying operation using a small signal.

The present invention has been completed taking into account the circumstances, which have been stated above, and provides a pulsed power amplifier whose amplitude variation in one pulse of a pulse signal subsequent to an amplification step is eliminated to provide a favorable linearity.

An aspect of the present invention inheres in an amplifier including a plurality of power amplifier elements connected in cascaded multiple stages, a first bias power supply, a second bias power supply, a switching circuit configured to switch a first output supplied from the first bias power supply in response to a modulation pulse so as to transmit the first output to the plurality of power amplifier elements, a pulse differentiating circuit configured to differentiate the modulation pulse by a given time constant, and an adder circuit configured to add the differentiated modulation pulse and a second output of the second bias power supply so as to transmit the differentiated modulation pulse added to the second output as an input bias voltage to at least one of the plurality of power amplifier elements except for a final stage in the cascaded multiple stages.

Another aspect of the present invention inheres in an amplifier including a plurality of power amplifier elements connected in cascaded multiple stages, a bias power supply, a switching circuit configured to switch an output supplied from the bias power supply in response to a modulation pulse so as to transmit the output to the plurality of power amplifier elements, a pulse differentiating circuit configured to differentiate the modulation pulse by a given time constant, a variable attenuator provided on an input side of at least one of the plurality of power amplifier elements and configured to attenuate a frequency signal, and an attenuator control circuit configured to generate a control signal for controlling the amount of attenuation to be achieved by the variable attenuator.

DETAILED DESCRIPTION OF EMBODIMENTS

Figure 1:
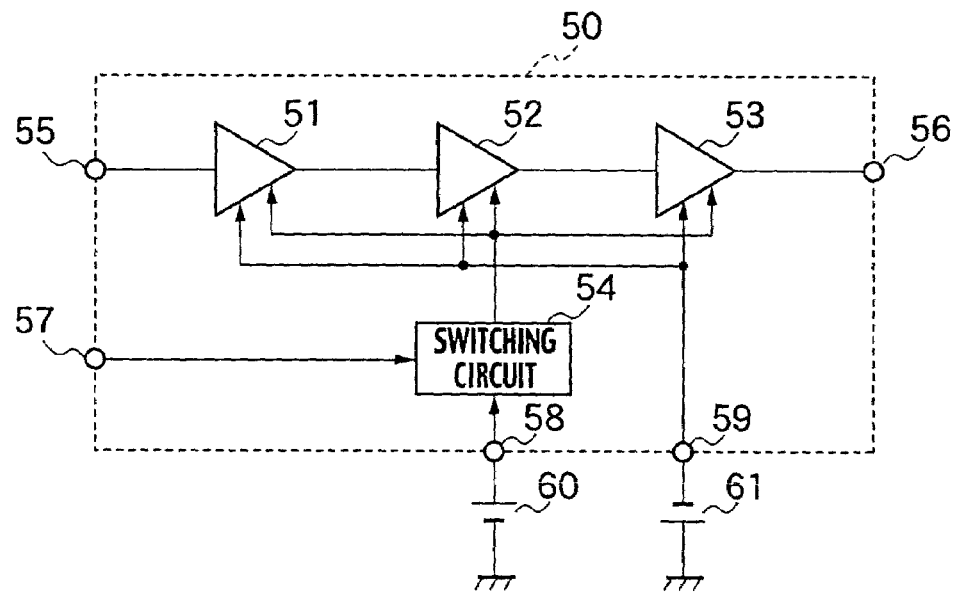
FIG. 1 is a block diagram schematically illustrating the related art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following description specific details are set forth, such as specific materials, process and equipment in order to provide thorough understanding of the present invention. It will be apparent, however, to one skilled in the art that the present invention may be practiced without these specific details. In other instances, well-known manufacturing materials, process and equipment are not set forth in detail in order not unnecessary obscure the present invention.

(First Embodiment)

Figure 2:
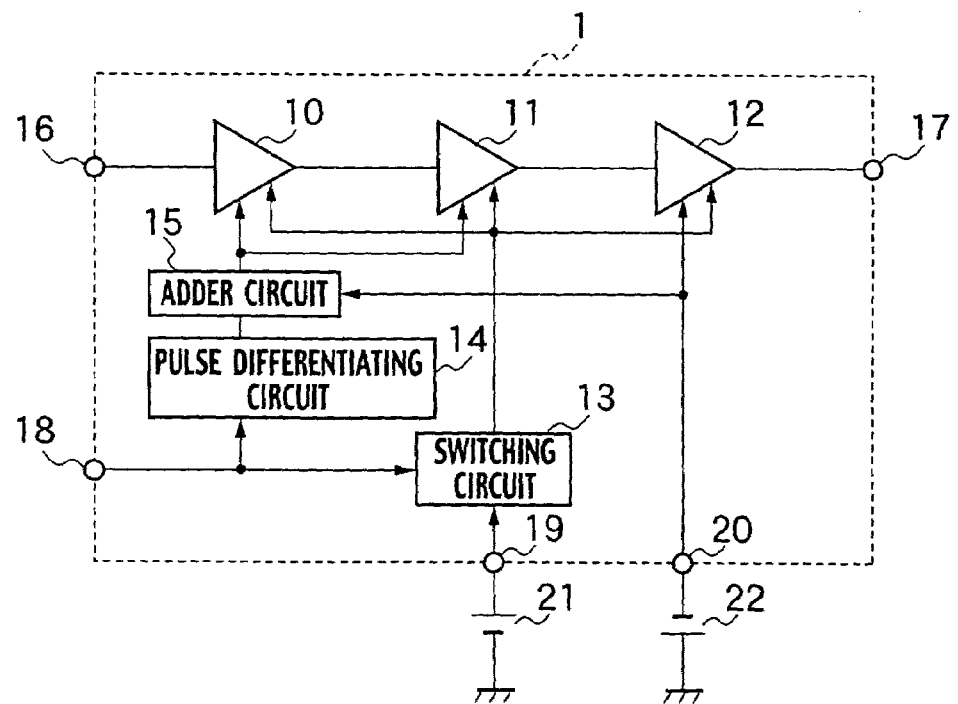
FIG. 2 is a block diagram schematically illustrating a pulsed power amplifier of a first embodiment according to the present invention.

FIG. 2 is a block diagram illustrating a pulsed power amplifier of a first embodiment according to the present invention. A pulsed power amplifier includes power amplifier elements, for example, N-channel MES type FETs that are connected in three cascaded stages. As shown in FIG. 2, the pulsed power amplifier 1 includes FETs 10, 11 and 12, a switching circuit 13, a pulse differentiating circuit 14 and an adder circuit 15. Also, the other elements include a signal input terminal 16, a signal output terminal 17, a pulse input terminal 18, a high potential terminal 19, and a low potential terminal 20.

The FETs 10 to 12 have gate electrodes serving as input terminals, drain electrodes serving as output terminals and source electrodes serving as common terminals, respectively. The FETs 10, 11 and 12 serve as a first stage, a second stage and a final stage which are connected in a cascaded arrangement. Further, the gate electrode of the FET 10 and the drain electrode of the FET 12 are connected to the signal input terminal 16 and the signal output terminal 17, respectively.

The switching circuit 13 switches an output supplied from a positive bias power supply 21 to the FETS 10 to 12 via the high potential terminal 19 in response to a modulation pulse being applied to the pulse input terminal 18.

The pulse differentiating circuit 14 differentiates a leading edge of the modulation pulse, applied through the pulse input terminal 18, by a given time constant to allow a resulting differentiated signal to be delivered to the adder circuit 15. The time constant is determined based on thermal time constants of the FETs 10 and 11 to which input bias voltage is applied from the adder circuit 15.

The adder circuit 15 adds an output voltage of a negative bias power supply 22, applied via the low potential terminal 20, and the differentiated signal resulting from the pulse differentiating circuit 14, and supplies a negative bias voltage to the inputs of the FETs 10 and 11, but not to the final stage FET 12. Also, the final stage FET 12 is directly supplied with the output voltage of the negative bias power supply 22, as an input negative bias voltage, via the low potential terminal 20.

Figure 3:
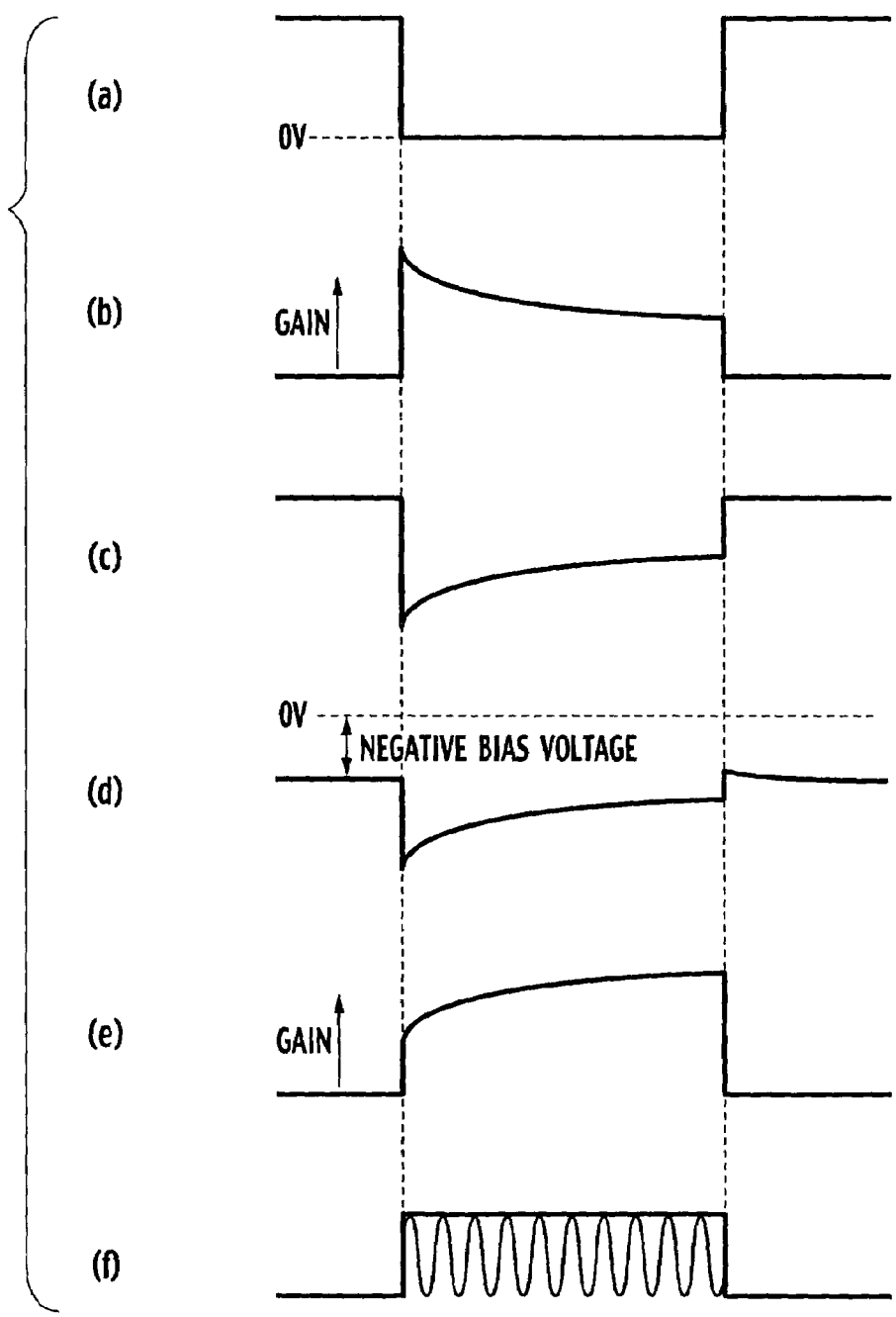
FIG. 3 is a view schematically showing pulse transmitted from each of units of the first embodiment.

The operation of the pulsed power amplifier 1 is described with reference to FIGS. 2 and 3.

The output voltages of the positive bias power supply 21 and the negative bias power supply 22 are supplied through the high potential terminal 19 and the low potential terminal 20, respectively. The signal input terminal 16 receives a high frequency signal that forms a source signal of a transmission pulse.

When the modulation pulse, exemplarily shown in FIG. 3(a), is inputted from the pulse input terminal 18, the modulation pulse is delivered to the switching circuit 13 and the pulse differentiating circuit 14. The switching circuit 13 switches the output voltage of the positive bias power supply 21 in response to the modulation pulse. Then, during a time period corresponding to a pulse width, the output voltage of the positive bias supply 21 is passed and outputted to the FETs 10 to 12.

Further, the pulse differentiating circuit 14 differentiates the modulation pulse, applied through the pulse input terminal 18, by a given time constant. The time constant is determined based on the thermal time constants of the FETs 10 and 11. That is, during pulse amplifying operations of the FETs 10 and 11, the temperatures of respective channels increase and, as exemplarily shown in FIG. 3(b), amplification gains of the FETs 10 and 11 decrease in one pulse from a leading edge of the pulse toward a trailing edge thereof in dependence on the thermal time constants. The pulse differentiating circuit 14 differentiates the modulation pulse to generate a voltage waveform, as exemplarily shown in FIG. 3(c), which corresponds to variation in the amplification gain as shown in FIG. 3(b) in terms of time, and which in turn is transmitted to the adder circuit 15.

The adder circuit 15 adds the differentiated waveform, delivered from the pulse differentiating circuit 14, and the output voltage of the negative bias power supply 22 applied through the high potential terminal 20. After the adding operation, as shown in FIG. 3(d), an output voltage has a waveform in which the voltage varies in phase in dependence on the thermal time constants of the FETs 10 and 11 from the leading edge of the modulation pulse toward the trailing edge thereof. This voltage waveform is applied to the inputs of the FETs 10 and 11 as the input bias voltage, respectively.

Due to variation in the input bias voltage, the FETs 10 and 11 cause the amplification gain to vary in a manner as shown in FIG. 3(e). That is, the amplification gain varies to compensate for variation in the amplification gain resulting from the thermal time constant in one pulse as shown in FIG. 3(b).

The high frequency signal supplied from the signal input terminal 16 is pulse amplified in each stage of the FETs 10 to 12 that operate based on a biased condition determined in a such a manner as mentioned above. The input bias voltage transmitted to FETs 10 and 11 is determined to vary based on the thermal time constants of the associated FETs to suppress variation in the amplification gain in one pulse as shown in FIG. 3(f). Thus, a resulting output occurs with reduced amplitude fluctuation in one pulse as shown in FIG. 3(f) and is delivered to a subsequent stage. The high frequency signal is amplified in the final stage FET 12 under an optimum input signal condition and biased condition to be outputted from the signal output terminal 17 as a transmission pulse signal.

As set forth above, with the first embodiment, the input bias voltage to be applied to the FETs is varied in dependence on the thermal time constants of the FETs used as the respective power amplifier elements to compensate for variation in the amplification gain in terms of time in one pulse during pulse amplifying operation. This enables the pulse amplification to be achieved at a stabilized gain, thereby making it possible to eliminate amplitude fluctuation of the pulse signal in one pulse subsequent to the amplification step.

Further, no control is performed on the final stage FET that forms part of the FETs connected in cascaded multiple stages. Instead, the control is performed on a preceding stage wherein the saturated output level is not controlled but the amplification gain is controlled. Therefore, the pulse is amplified without an excessively increased input to be applied to the FETs involving the final stage, thereby making it possible to obtain an amplification characteristic with less intermodulation distortion, resulting from intermodulation occurring at a higher order, to provide a favorable linearity.

Also, while the pulse power amplifier 1 includes the three cascaded stages and controls the input bias voltage for the initial stage and second stage, the present invention is not limited to particular number of stages and a particular amplifying stage delivered input bias voltage can be appropriately selected in accordance with the allocation of the amplification gain.

Furthermore, a pulsed power amplifier that includes power amplifier elements comprised of bipolar transistors, which are connected in cascaded multiple stages with a base electrode serving as an input terminal, a collector electrode serving as an output terminal and an emitter electrode serving as a common terminal, can achieve the same advantageous effects as those set forth above.

Figure 6:
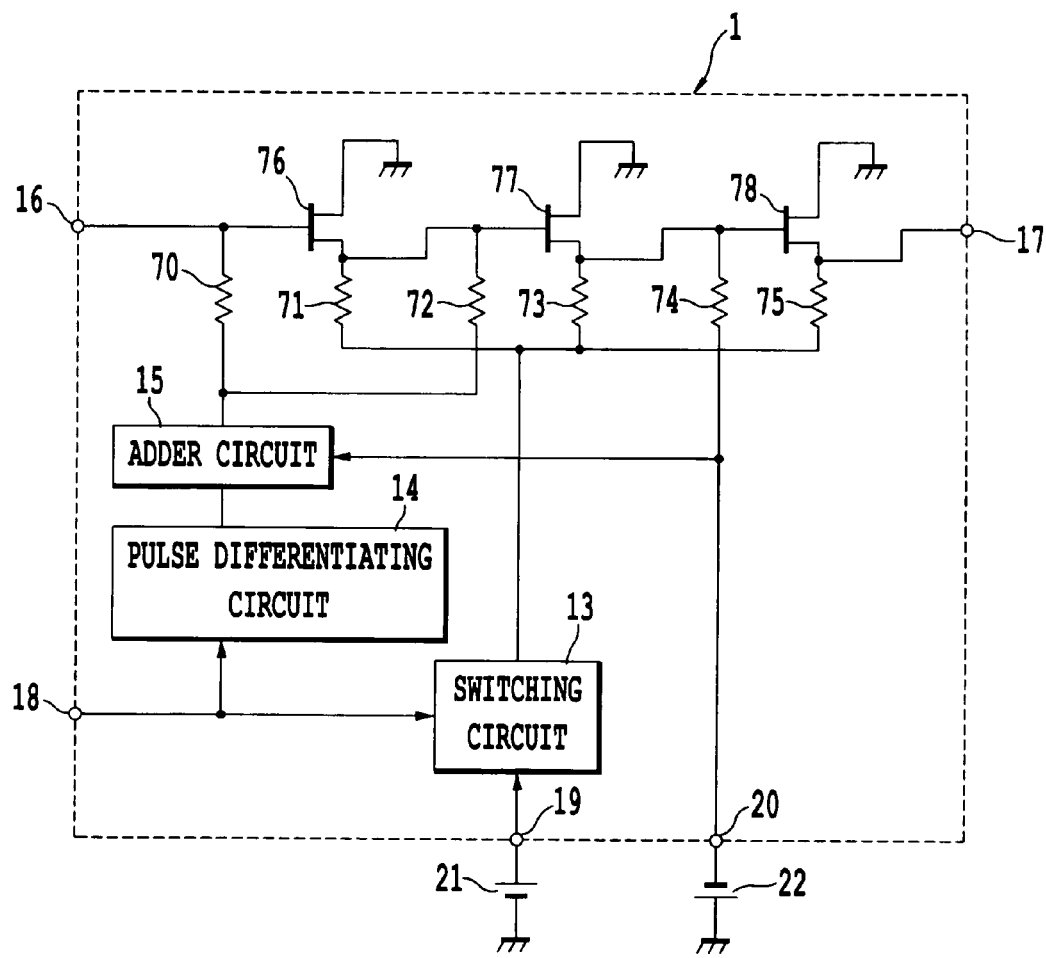
FIG. 6 is a schematic diagram of an amplifier according to another embodiment of the present invention.

FIG. 6 is a schematic diagram of an amplifier according to another embodiment of the present invention. In the embodiment of FIG. 6, the output of adder circuit 15 is connected to gate electrodes of FETs 76 and 77 through bias resistors 70 and 72, respectively, and the low potential terminal 20 is connected to the gate electrode of FET 78 through bias resistor 74. Further, the output of switching circuit 13 is connected to drain electrodes of FETs 76. 77 and 78 through bias resistors 71. 73 and 75, respectively, and the source electrodes of FETs 76. 77 and 78 are connected to ground.

Figure 7:
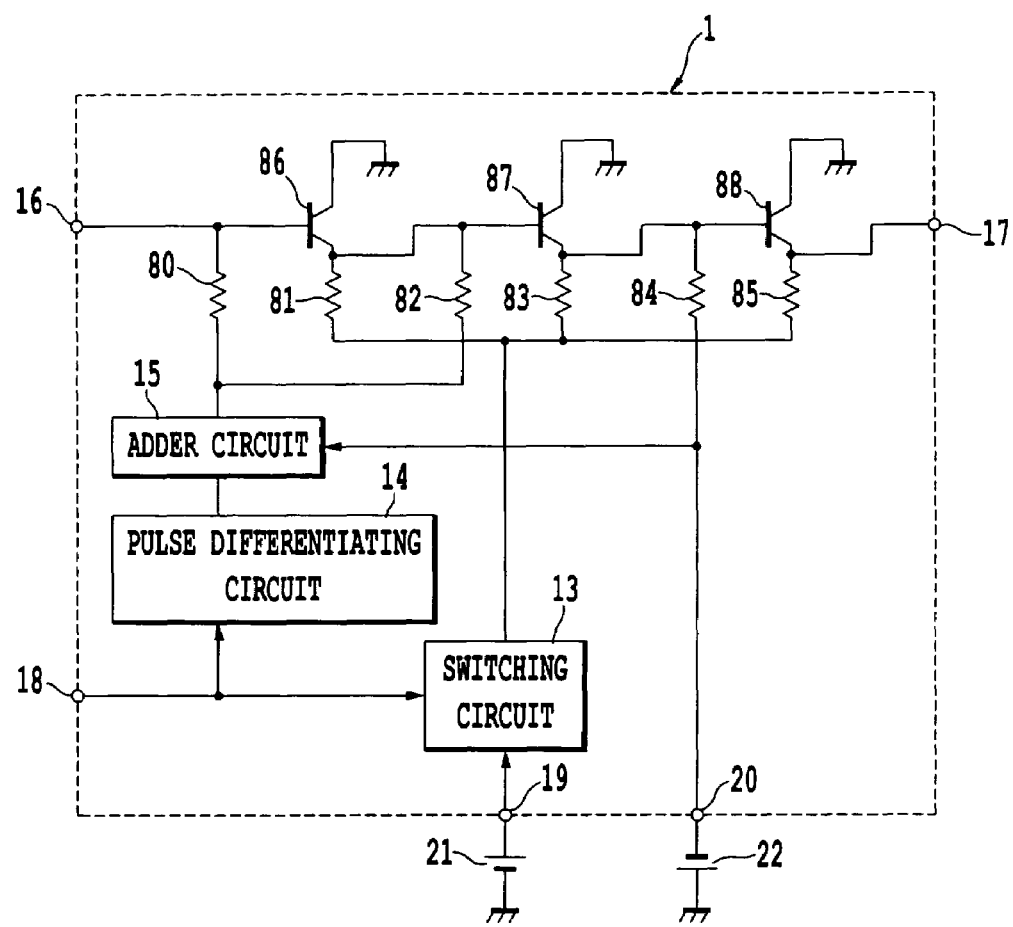
FIG. 7 is a schematic diagram of an amplifier according to another embodiment of the present invention.

FIG. 7 is a schematic diagram of an amplifier according to another embodiment of the present invention. In the embodiment of FIG. 7, the output of adder circuit 15 is connected to base electrodes of bipolar transistors 86 and 87 through bias resistors 80 and 82, respectively, and the low potential terminal 20 is connected to the gate electrode of bipolar transistor 88 through bias resistor 84. Further, the output of switching circuit 13 is connected to collector electrodes of bipolar transistors 86. 87 and 88 through bias resistors 81. 83 and 85, respectively, and the emitter electrodes of bipolar transistors 86. 87 and 88 are connected to ground.

(Second Embodiment)

Figure 4:
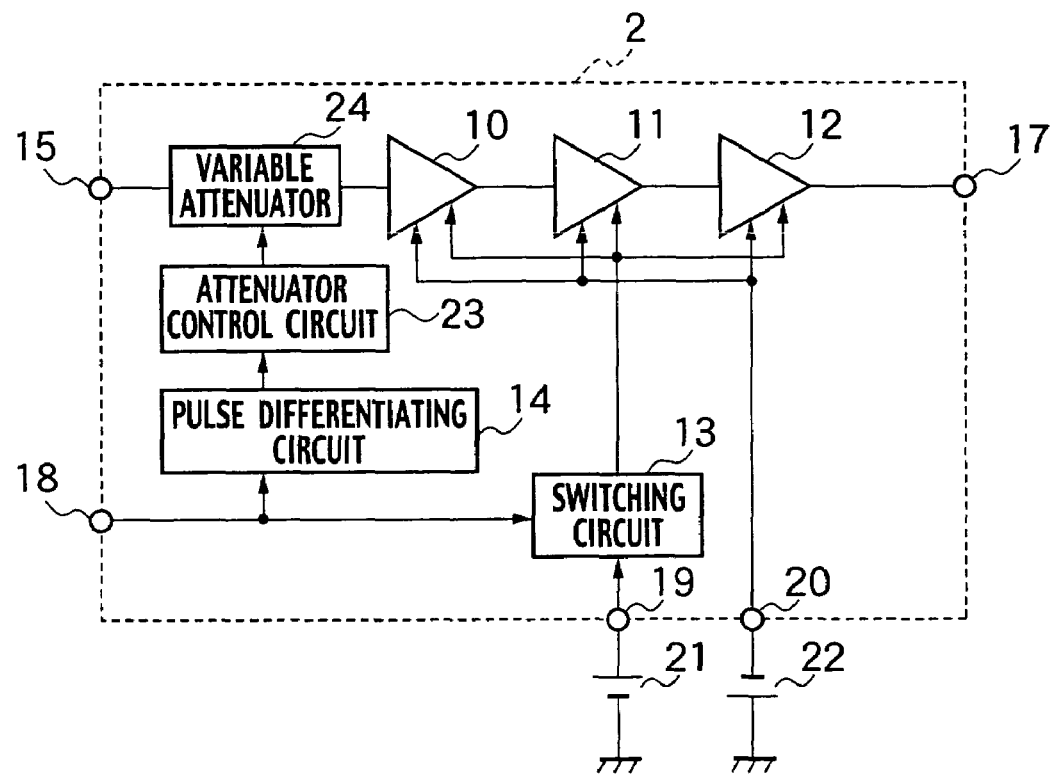
FIG. 4 is a block diagram schematically illustrating a pulsed power amplifier of a second embodiment according to the present invention

FIG. 4 is a block diagram illustrating a pulsed power amplifier of a second embodiment according to the present invention. With respect to various component parts of the second embodiment, the same component parts as those of the first embodiment shown in FIG. 2 bear like reference numerals. A pulse power amplifier of the second embodiment compensates amplitude variation in one pulse of a pulse signal based on the amount of attenuation of a variable attenuator. The amount of attenuation is varied in response to the thermal time constants of the FETs. Hereinafter, description is made with reference to FIG. 4.

As shown in FIG. 4, a pulsed power amplifier 2 includes the FETs 10 to 12, the switching circuit 13, the pulse differentiating circuit 14, an attenuator control circuit 23 and a variable attenuator 24. The pulse power amplifier 2 further includes the signal input terminal 16, the signal output terminal 17, the pulse input terminal 18, the high potential terminal 19 and the low potential terminal 20.

The FETs 10 to 12 have gate electrodes serving as input terminals, drain electrodes serving as output terminals and the source electrodes serving as common terminals, respectively. The FETs 10 to 12 are connected in a cascade to form a first stage, a second stage and a final stage, respectively. Also, the gate electrode of the FET 10 is connected to the signal input terminal 16 via the variable attenuator 24, and the drain electrode of the FET 12 is connected to the signal output terminal 17.

The switching circuit 13 switches the output of the positive bias power supply 21 based on a modulation pulse applied to the pulse input terminal 18 to transmit a positive operational power supply voltage to the FETs 10 to 12.

The pulse differentiating circuit 14 differentiates a leading edge of the modulation pulse, applied to the pulse input terminal 18, by a given time constant. Then, a resulting differentiated signal is delivered to the attenuator control circuit 23. With the second embodiment, the time constant, used for differentiation as mentioned above, is determined based on the thermal time constants of the FETs 10 to 12.

The attenuator control circuit 23 generates a control signal, in dependence on the differentiated signal delivered from the pulse differentiating circuit 14 for controlling the amount of attenuation to be achieved by the variable attenuator 24, and transmits the control signal to the variable attenuator 24. The variable attenuator 24 includes, for instance, a variable attenuator such as a diode which is able to continuously control the amount of attenuation. The variable attenuator 24 also attenuates a high frequency signal, applied through the signal input terminal 16, in dependence on the control signal delivered from the attenuator control circuit 23 to allow a resulting attenuated signal to be delivered to the FET 10. Connected to the low potential terminal 20 is a fixed negative bias power supply 22, by which a negative bias voltage required for the FETs 10 to 12 is supplied.

Figure 5:
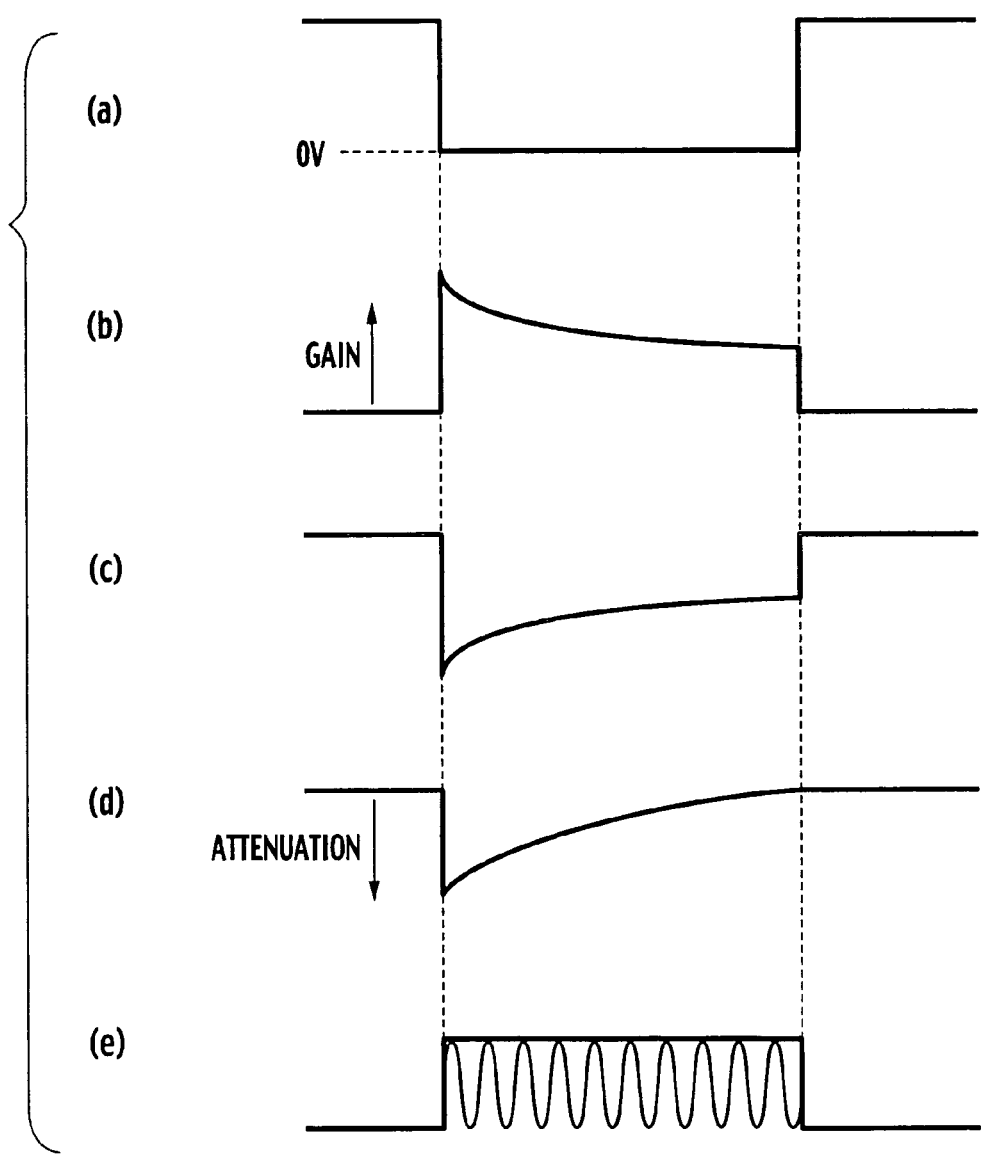
FIG. 5 is a view schematically showing pulse transmitted from each of units of the second embodiment.

The operation of the pulsed power amplifier 2 is described with reference to illustrative views of FIGS. 4 and 5 mentioned above.

The output voltages of the positive bias power supply 21 and the negative bias power supply 22 are supplied through the high potential terminal 19 and the low potential terminal 20, respectively. The signal input terminal 16 is applied with a high frequency signal that forms a source signal of a transmission pulse.

When a modulation pulse, exemplarily shown in FIG. 5(a), is applied through the pulse input terminal 18, the modulation pulse is delivered to the switching circuit 13 and the pulse differentiating circuit 14. The switching circuit 13 switches the output voltage of the positive bias power supply 21, supplied through the high potential terminal 19, by the modulation pulse. Then, during a period corresponding to a pulse width, the output voltage of the positive bias power supply 21 is passed and outputted to the FETs 10 to 12.

The pulse differentiating circuit 14 differentiates the modulation pulse, delivered through the pulse input terminal 18, by a given time constant. The time constant is determined based on the thermal time constants of the FETs 10 to 12. That is, due to increases in channel temperature of the FETs 10 to 12 during a pulsed amplifying operation, the FETs 10 to 12 operate such that the amplification gain decreases from a leading edge of the pulse toward a trailing edge thereof in one pulse in accordance with the thermal time constants of the FETs, as exemplarily shown in FIG. 5(b). By differentiating the modulation pulse, the pulse differentiating circuit 14 generates a voltage waveform, as exemplarily shown in FIG. 5(c), which corresponds to a variation in the amplification gain in terms of time and is outputted to the attenuator control circuit 23.

Depending upon the differentiated waveform delivered from the pulse differentiating circuit 14, the attenuator control circuit 23 generates a control signal for controlling the amount of attenuation to be achieved by the variable attenuator 24. An example of the resulting control signal is shown in FIG. 5(d). That is, the control signal forms a signal that controls the amount of attenuation to be achieved by the variable attenuator 24 in phase from the leading edge of the modulation pulse toward the trailing edge thereof so as to cancel the variation in the amplification gain in terms of time in one pulse applied to the FETs 10 to 12. The resulting control signal is delivered to the variable attenuator 24. The variable attenuator 24 attenuates the high frequency signal, delivered from the signal input terminal 16, in accordance with the control signal.

A level control is performed on the high frequency signal applied to the signal input terminal 16 by the variable attenuator 24. Then, the high frequency signal is pulse amplified in each stage of the FETs 10 to 12 so as to be transmitted from the signal output terminal 17. The variable attenuator 24 controls the amount of attenuation to be applied to the high frequency signal in response to the control signal delivered from the attenuator control circuit 23. Therefore, the first stage FET 10 is provided with the level controlled high frequency signal so as to compensate for variation in the amplification gain in one pulse and then amplified. The amplified high frequency signal is sequentially delivered to the subsequent stages. As a result, a transmission pulse signal, whose amplitude variation in one pulse is eliminated in a manner as exemplarily shown in FIG. 5(*e*), is outputted from the signal output terminal 17.

As set forth above, with the second embodiment, the level of the high frequency signal to be applied to the FETs is controlled in dependence on the thermal time constants of the FETs used as the power amplifier elements to compensate variation in amplification gain in terms of time in one pulse during pulsed amplifying operation. This enables reduction in amplitude variation in one pulse of the pulse signal subsequent to amplification.

Further, the respective FETs connected in cascaded multiple stages perform the pulsed amplifying operation without causing an excessively large input to be present in a region that does not form a saturated area. This results in a capability of achieving an amplification characteristic with less intermodulation distortion occurring at a higher order, to provide a favorable linearity.

Also, while the pulse power amplifier 2 includes the three cascaded stages and the variable attenuator 24 provided at the input side of the power amplifier element of the first stage, the present invention is not limited to such a particular number of stages. Variable attenuators may be connected to the input side of the power amplifier elements of the subsequent stage or of plural stages by appropriately allocating the amount of attenuation.

Moreover, a pulsed power amplifier that includes power amplifier elements comprised of bipolar transistors, each of which has a base electrode serving as an input terminal, a collector electrode serving as an output terminal and an emitter electrode serving as a common terminal and which are connected in cascaded multiple stages, is able to achieve the same advantageous effects as those set forth above.

Figure 8:
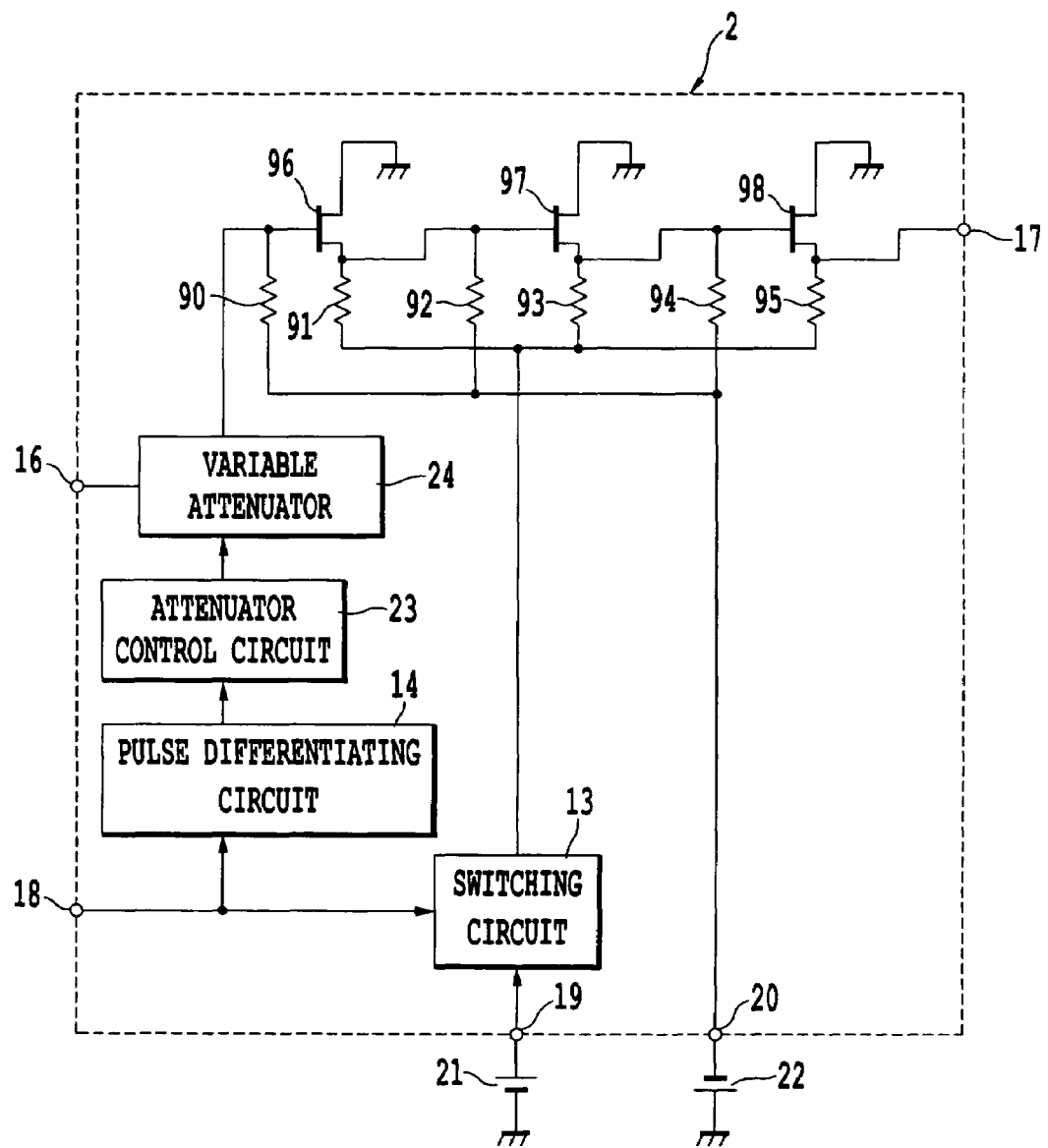
FIG. 8 is a schematic diagram of an amplifier according to another embodiment of the present invention.

FIG. 8 is a schematic diagram of an amplifier according to another embodiment of the present invention. In the embodiment of FIG. 8, the output of switching circuit 13 is connected to drain electrodes of FETs 96, 97 and 98 through bias resistors 91, 93 and 95, respectively, and the low potential terminal 20 is connected to the gate electrodes of FETs 96, 97 and 98 through bias resistors 90, 92 and 94, Further, the source electrodes of FETs 96, 97 and 98 are connected to ground.

Figure 9:
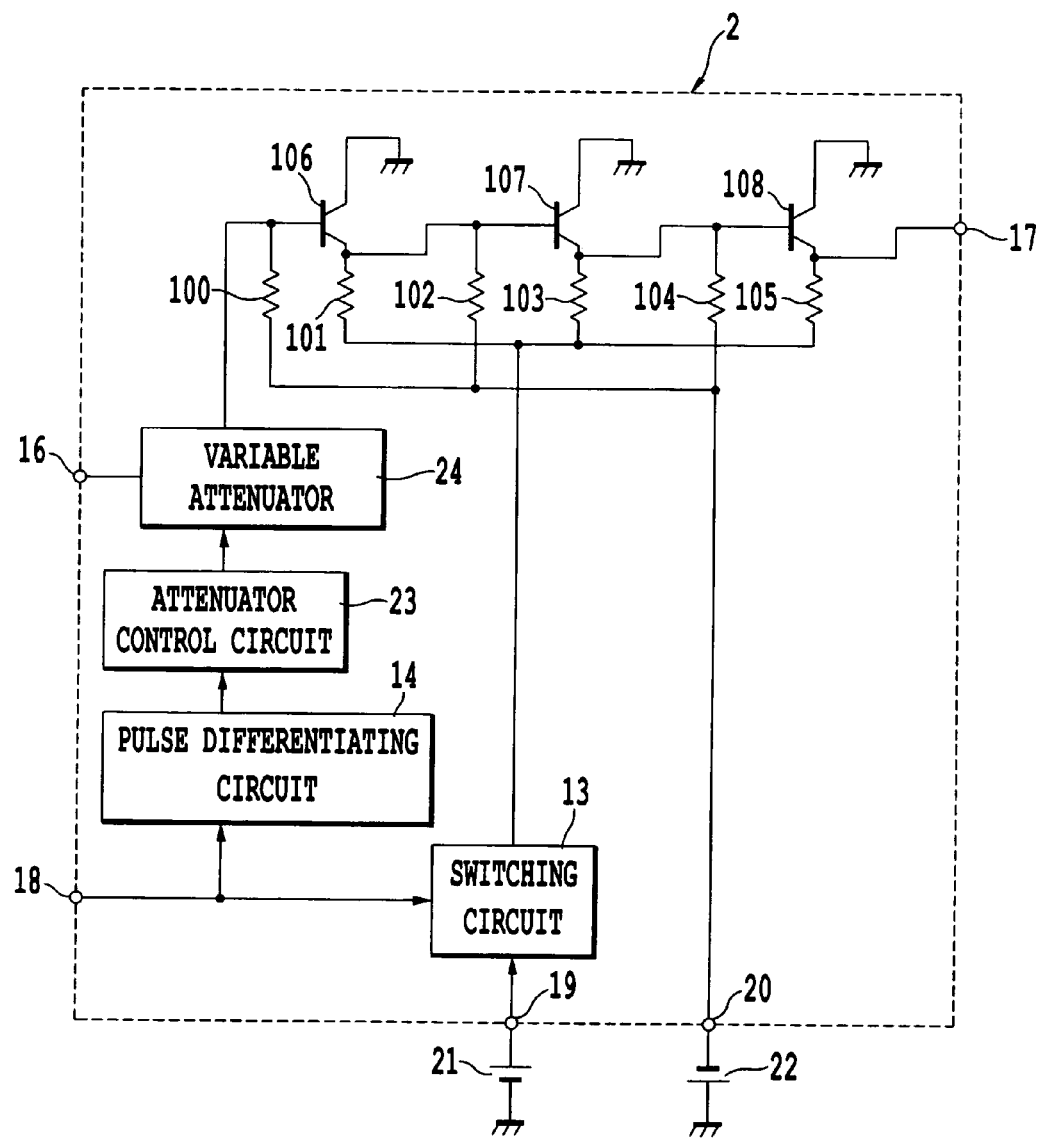
FIG. 9 is a schematic diagram of an amplifier according to another embodiment of the present invention.

FIG. 9 is a schematic diagram of an amplifier according to another embodiment of the present invention. In the embodiment of FIG. 9, the output of switching circuit 13 is connected to collector electrodes of bipolar transistors 106, 107 and 108 through bias resistors 101, 103 and 105, respectively, and the low potential terminal 20 is connected to the base electrodes of bipolar transistors 106, 107 and 108 through bias resistors 100, 102 and 104. Further, the emitter electrodes of bipolar transistors 106, 107 and 108 are connected to ground.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

The invention claimed is:

1. An amplifier comprising:
    a plurality of power amplifier elements connected in cascaded multiple stages;
    a first bias power supply;
    a second bias power supply;
    a switching circuit configured to switch a first output supplied from the first bias power supply in response to a modulation pulse so as to transmit the first output to the plurality of power amplifier elements;
    a pulse differentiating circuit configured to differentiate the modulation pulse by a given time constant; and
    an adder circuit configured to add the differentiated modulation pulse and a second output of the second bias power supply so as to transmit the differentiated modulation pulse added to the second output as an input bias voltage to at least one of the plurality of power amplifier elements except for a final stage in the cascaded multiple stages.

2. The amplifier of claim 1, wherein the plurality of power amplifier elements is a plurality of field-effect transistors including gate electrodes serving as input terminals, drain electrodes serving as output terminals and source electrodes serving as common terminals, respectively.

3. The amplifier of claim 1, wherein the plurality of power amplifier elements is a plurality of bipolar transistors including base electrodes serving as input terminals, collector electrodes serving as output terminals and emitter electrodes serving as common terminals, respectively.

4. The amplifier of claim 1, wherein the given time constant is determined based on a thermal time constant of at least one of the plurality of power amplifier elements provided with the input bias voltage from the adder circuit thereto.

5. An amplifier comprising:
    a plurality of power amplifier elements connected in cascaded multiple stages;
    a bias power supply;
    a switching circuit configured to switch an output supplied from the bias power supply in response to a modulation pulse so as to transmit the output to the plurality of power amplifier elements;
    a pulse differentiating circuit configured to differentiate the modulation pulse by a given time constant;
    a variable attenuator provided on an input side of at least one of the plurality of power amplifier elements and configured to attenuate a frequency signal; and
    an attenuator control circuit configured to control the amount of attenuation to be achieved by the variable attenuator based on the differentiated modulation pulse.

6. The amplifier of claim 5, wherein the plurality of power amplifier elements is a plurality of field-effect transistors including gate electrodes serving as input terminals, drain electrodes serving as output terminals and source electrodes serving as common terminals, respectively.

7. The amplifier of claim 5, wherein the plurality of power amplifier elements is a plurality of bipolar transistors including base electrodes serving as input terminals, collector electrodes serving as output terminals and emitter electrodes serving as common terminals, respectively.

8. The amplifier of claim 5, wherein the given time constant is determined based on a thermal time constant of at least one of the plurality of power amplifier elements.

* * * * *